United States Patent [19]

Klymus

[11] 4,043,815

[45] Aug. 23, 1977

[54] METHOD OF MAKING PRINTING PLATES FOR OFFSET PRINTING

[76] Inventor: Stephane Klymus, 19 rue Gagner, Ivry-sur-Seine, val de Marne, France

[21] Appl. No.: 715,384

[22] Filed: Aug. 18, 1976

Related U.S. Application Data

[63] Continuation of Ser. No. 592,521, July 2, 1975, abandoned, which is a continuation of Ser. No. 373,602, June 25, 1973, abandoned.

[30] Foreign Application Priority Data

June 28, 1972 France .............................. 72.23365

[51] Int. Cl.² ........................................ G03F 7/02
[52] U.S. Cl. ................................. 96/33; 101/456; 101/467
[58] Field of Search ............... 101/456, 426, 211, 466, 101/467; 96/33

[56] References Cited

U.S. PATENT DOCUMENTS

| | | | |
|---|---|---|---|
| 1,155,352 | 10/1915 | Grass | 101/466 |
| 1,225,246 | 5/1917 | Hess | 101/211 |
| 1,300,729 | 4/1919 | Huebner | 96/33 |
| 1,504,782 | 8/1924 | Powrie | 96/33 |
| 1,577,181 | 3/1926 | Crowe | 101/426 |
| 2,124,680 | 7/1938 | Wilkinson | 96/33 |

FOREIGN PATENT DOCUMENTS

1,150,751  4/1969  United Kingdom ................. 101/211

OTHER PUBLICATIONS

Elements of Photogravure, by Bennett; London, 1927; pp. 18-25.
Handbook of Lithography, by Cumming; London, 1932; pp. 276-279.
Practical Photo—Lithography, by Willy; London, 1932; pp. 130-161.
The Lithographers Manual, by Strauss; N.Y., N.Y.; pp. 5:57, 8:5-8:7, Waltwin Pub. Co.; vol. 1.

*Primary Examiner*—Clyde I. Coughenour
*Attorney, Agent, or Firm*—Hill, Gross, Simpson, Van Santen, Steadman, Chiara & Simpson

[57] ABSTRACT

In a method of making a printing plate for use in offset printing, a positive transparency of the design to be printed is first prepared in such a way that when the sensitive layer thereof is observed the design thereon is seen as right side out. This positive transparency is then mounted on a support provided with registration marks, with the sensitive layer of the transparency turned outwardly, and any errors in the transparency are corrected. The mounting is then used to contact-print a negative transparency on which the design is seen inside out when its sensitive layer is observed. Finally the design is formed on the printing plate employing the negative transparency, after any necessary re-touching of the latter.

3 Claims, No Drawings

METHOD OF MAKING PRINTING PLATES FOR OFFSET PRINTING

This is a continuation of application Ser. No. 572,521 filed July 2, 1975, now abandoned, which is a continuation of application Ser. No. 373,602, filed June 25, 1973, now abandoned.

This invention relates to the manufacture of printing plates for use in offset printing processes.

Offset printing is performed by means of a printing plate which carries the design to be printed and which is made in such a way that only the printing areas of the plate are receptive to the printing ink. The plate is wrapped around a first cylinder, known as the "plate cylinder", which rotates in contact with a second cylinder, known as the "blanket cylinder", on which the design is printed in order to be transferred to the sheet of paper. The sheet of paper passes between the blanket cylinder and a third cylinder, known as the "impression cylinder", in contact with the blanket cylinder. In this specification the term "design" is used to mean the subject-matter which is to be printed, which of course may range from simple characters, for example letters and numbers, to the most complicated patterns.

The formation of the design to be printed on the printing plate is usually done by photographic printing processes using negative or positive transparencies. In order that the design shall be sharp, it is important that the transparency and the plate should be in contact via their sensitive layers at the time of the design printing operation.

In the known processes, transparencies are used on which an observer sees the design to be printed inside out when he looks at the sensitive layer of the transparency since, due to the transfer which takes place on the blanket cylinder, the design must be copied right side out on the printing plate. According to these same processes, any necessary re-touching, intended to correct printing errors, is done on the plate itself, which necessitates long and delicate work.

The primary object of the present invention is to provide an improved method of making printing plates for offset printing processes which avoids the disadvantage just mentioned.

The method according to the invention involves starting from positive transparencies printed in such a way that, when an observer looks at the sensitive layer, he sees the design the right side out; then the transparencies are mounted on a support provided, in usual manner, with registration marks, the sensitive layer of the said transparencies being turned outwardly, so that the design is visible and right side out; a contact print is then made, for example on paper, employing the mounting, in order to obtain a proof document by means of which the design can be checked and any corrections which must be made to the mounting can be determined. After the mounting has been corrected, it is used for contact printing a negative transparency on which the design, this time, is seen inside out by an observer who looks at the sensitive layer. This negative transparency is re-touched if necessary and is then used for the formation of the design on the printing plate.

This printing plate may be of any known type which enables production of the design thereon from negative transparencies.

Advantageously, polymetal plates may be used, the external surface of which is formed by a thin layer of copper or copper alloy applied on a layer of chromium or chromium alloy. The copper is very receptive to the printing ink, whereas the chromium, when it is wetted, repels the ink.

The plate is initially covered with a photosensitive layer, and after printing and development, the non-printed regions are exposed while the printed regions remain protected by the printed layer. The copper is then etched away in the non-printed regions in order to expose the chromium in these regions. The plate is then cleaned and its printing regions remain covered with copper.

The following description is an example of how the invention may be put into effect.

Although the positive transparencies which are used for making the printing plates are printed in such a way that an observer who looks at the sensitive layer sees the design inside out (as in a mirror), the method of the invention starts from positive transparencies on which under the same conditions the observer sees the design the right side out.

The mounting of the transparencies is then proceeded with in the usual manner, that is to say there is placed on a registration sheet (which carries conventional registration marks, and which has perforations enabling it to be adjusted, in a well-defined position, on a mounting table provided with corresponding projections) a transparent sheet which is perforated in an identical manner and which is adjusted in the same way on the mounting table.

The positive transparencies, with the sensitive layer turned outwardly (i.e. so that the design is seen the right side out), are placed on the transparent sheet, so that their position is correct in relation to the registration marks of the registration sheet, and they are fixed on the transparent sheet, for example using pieces of transparent adhesive tape.

The assembly of the transparent sheet and the transparencies is then removed from the registration sheet and a transparent support is fixed to the back of the transparent sheet, this transparent support being provided with the same registering perforations as the previously mentioned sheets. This support carries, outside the printing area, conventional registration marks, as well as colour registration marks if polychromatic printing is to be done (which requires one printing plate per colour). The mounting is done in such a way that the registration marks of the support coincide with those of the registration sheet when the perforations of the various elements of the mounting also coincide.

From the mounting constituted by the support with the registration marks, the transparent sheet and the positive transparencies, a contact print is made on paper so as to obtain a positive proof document, serving for checking the design and on which are indicated the various corrections to be made. On the basis of this document the mounting is corrected, if this is necessary.

Using the mounting, there is then printed a negative transparency, with the sensitive layer of the mounting against the sensitive layer of the negative transparency. When the sensitive layer of the printed negative transparency is observed, the design thereon will be seen inside out. After any necessary re-touching this negative transparency is used for producing the design on the printing plate which is to be used for offset printing.

This production of the design on the printing plate is again made with sensitive layer against sensitive layer, so that the printing plate, once made, carries the design visible the right side out.

The invention may be applied to all printing plates which allow of production of the design thereon from negative transparencies. Preferably, polymetal plates of the copper-chromium type previously mentioned are used.

The invention has the considerable advantage that the mounting can be made by means of positive transparencies, which is much more simple than with negative transparencies, since there is no need to employ masks and the various registration marks are positively marked on a transparent base.

The final negative transparency, made after checking and correction of the mounting, offers a convenient means for effecting any re-touching without being necessary to work on the printing plate. The printing of the latter remains very simple.

Of course, modifications can be made to the method which has just been described, in particular by the substitution of equivalent technical means, without departing from the scope of the invention as defined in the ensuing claims.

What is claimed is:

1. A method of making a printing plate for offset printing, comprising the steps of:
   a. providing a positive transparency having a transparent non-sensitive base and a sensitive layer thereon;
   b. printing a design on the sensitive layer of said positive transparency, the design when viewed by an observer from the sensitive layer side appearing right-reading;
   c. mounting said positive transparency on a support provided with registration marks, said design carrying layer of the positive transparency being outward toward the observer on said mounting so that the design is rightreading for analysis;
   d. contact printing a proof from said positive transparency for analysis of the mounted transparency and indicating connections on said proof;
   e. using the indicated proof for correcting errors in the mounted transparency;
   f. providing a negative transparency having a transparent non-sensitive base and a sensitive layer thereon;
   g. contact-printing from said positive transparency a negative of the design on the sensitive layer of the negative transparency, said design appearing as a mirror image by an observer who looks at the sensitive layer said thereof;
   h. providing a printing plate having a sensitive layer; and
   i. reproducing the design of the negative transparency onto the printing plate by placing the design carrying layer of the negative transparency against the sensitive layer of said printing plate.

2. A method according to claim 1, in which the printing plate employed is a polymetal plate the surface of which carries a layer of copper or copper alloy on a layer of chromium or chromium alloy.

3. A method according to claim 1, in which re-touching of the design on the negative transparency is effected prior to producing the design on the printing plate.

* * * * *